(12) United States Patent
Hase

(10) Patent No.: US 7,776,673 B2
(45) Date of Patent: Aug. 17, 2010

(54) METHOD OF MANUFACTURING SEMICONDUCTOR DEVICE

(75) Inventor: Takashi Hase, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 214 days.

(21) Appl. No.: 12/048,482

(22) Filed: Mar. 14, 2008

(65) Prior Publication Data

US 2008/0227280 A1 Sep. 18, 2008

(30) Foreign Application Priority Data

Mar. 14, 2007 (JP) ............................. 2007-065232

(51) Int. Cl.
*H01L 21/336* (2006.01)
*H01L 21/8234* (2006.01)
*H01L 21/3205* (2006.01)
*H01L 21/4763* (2006.01)

(52) U.S. Cl. ...................... 438/197; 438/299; 438/585; 438/257

(58) Field of Classification Search ................. 438/197, 438/585, 587, 664, 218, 299, 257
See application file for complete search history.

(56) References Cited

U.S. PATENT DOCUMENTS

| 6,054,770 A * | 4/2000 | Toyoda et al. ............... 257/762 |
| 2006/0263961 A1* | 11/2006 | Kittl et al. .................... 438/199 |
| 2007/0026600 A1* | 2/2007 | Komori ....................... 438/199 |

FOREIGN PATENT DOCUMENTS

JP 2006-100431 A 4/2006

OTHER PUBLICATIONS

Yoshinori Tsuchiya et al., "Physical Mechanism of Work Function Modulation due to Impurity Pileup at NI-FUSI/Si) (N) Interface", Advanced LSI technology Labortary, Corporate R&D Center, Toshiba Corp., 2005, pp. 1-4.
Kensuke Takahashi et al., "Dual Workfunction Ni-Silicide/HfSiON Gate Stacks by Phase-Controlled Full-Silicidation (PC-FUSI) Technique for 45nm-node LSTP and LOP Devices", System Devices Research Laboratories, NEC Corporation, 2004, pp. 1-4.
Masayuki Terai et al., Highly Reliable HfSiON CMOSFET with Phase Controlled NiSi (NFET) and Ni3Si (PFET) FUSI Gate Electrode, 2005, Symposium on VLSI Technology Digest of Technical Papers, pp. 68 and 69.
A. Veloso et al., "Dual Work Function Phase Controlled NI-FUSI CMOS (NiSi NMOS, Ni2Si or NI12Si12 PMOS): Manufacturability Reliability & Process Window Improvement by Scarificial SiGe cap", 2006 Symposium on VLSI Technology Digest of Technical Papers, pp. 1 and 2.
A. Lauwers et al., "CMOS Integration of Dual Work Function Phase Controlled Ni FUSI with Simultaneous Silicidation of NMOS (NiSi) and PMOS (Ni-rich silicide) Gates on HfSiOn", pp. 1-4.

* cited by examiner

*Primary Examiner*—Chuong A. Luu
(74) *Attorney, Agent, or Firm*—Young & Thompson

(57) ABSTRACT

According to the present invention, it is provided a method of manufacturing a semiconductor device comprising a PMOS transistor and an NMOS transistor, wherein the method facilitates obtaining a full silicide phase of a suitable composition for the NMOS transistor and the PMOS transistor respectively, with fewer mask layers and through a fewer number of manufacturing steps.

11 Claims, 8 Drawing Sheets

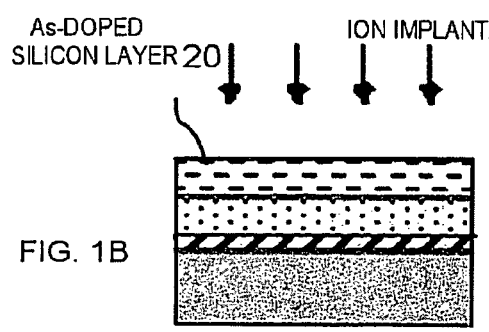
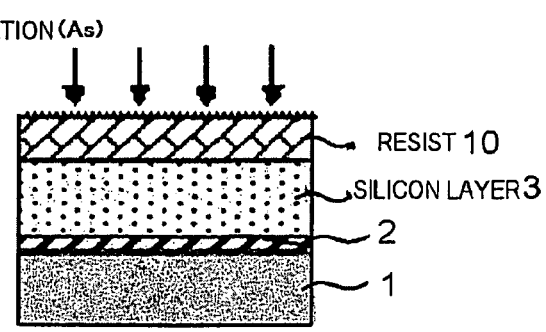
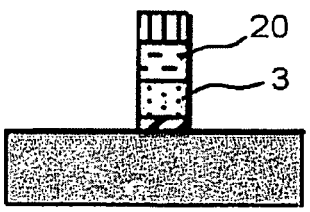
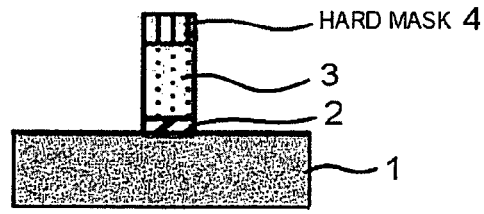
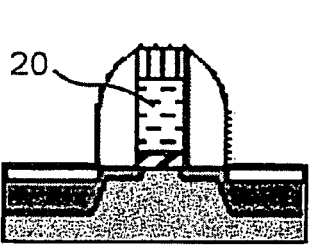
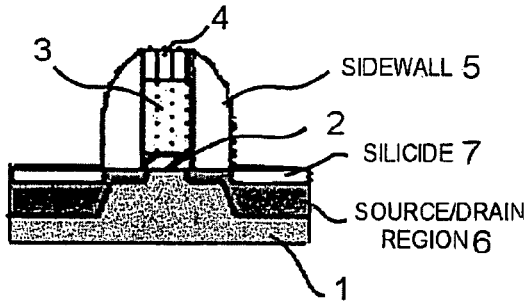
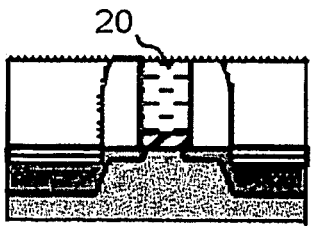
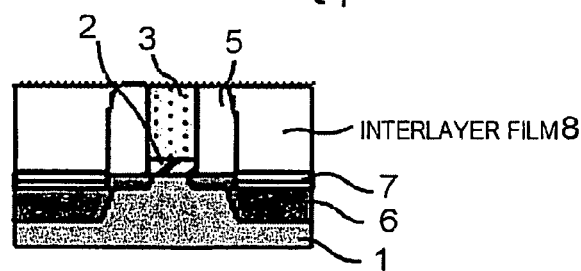

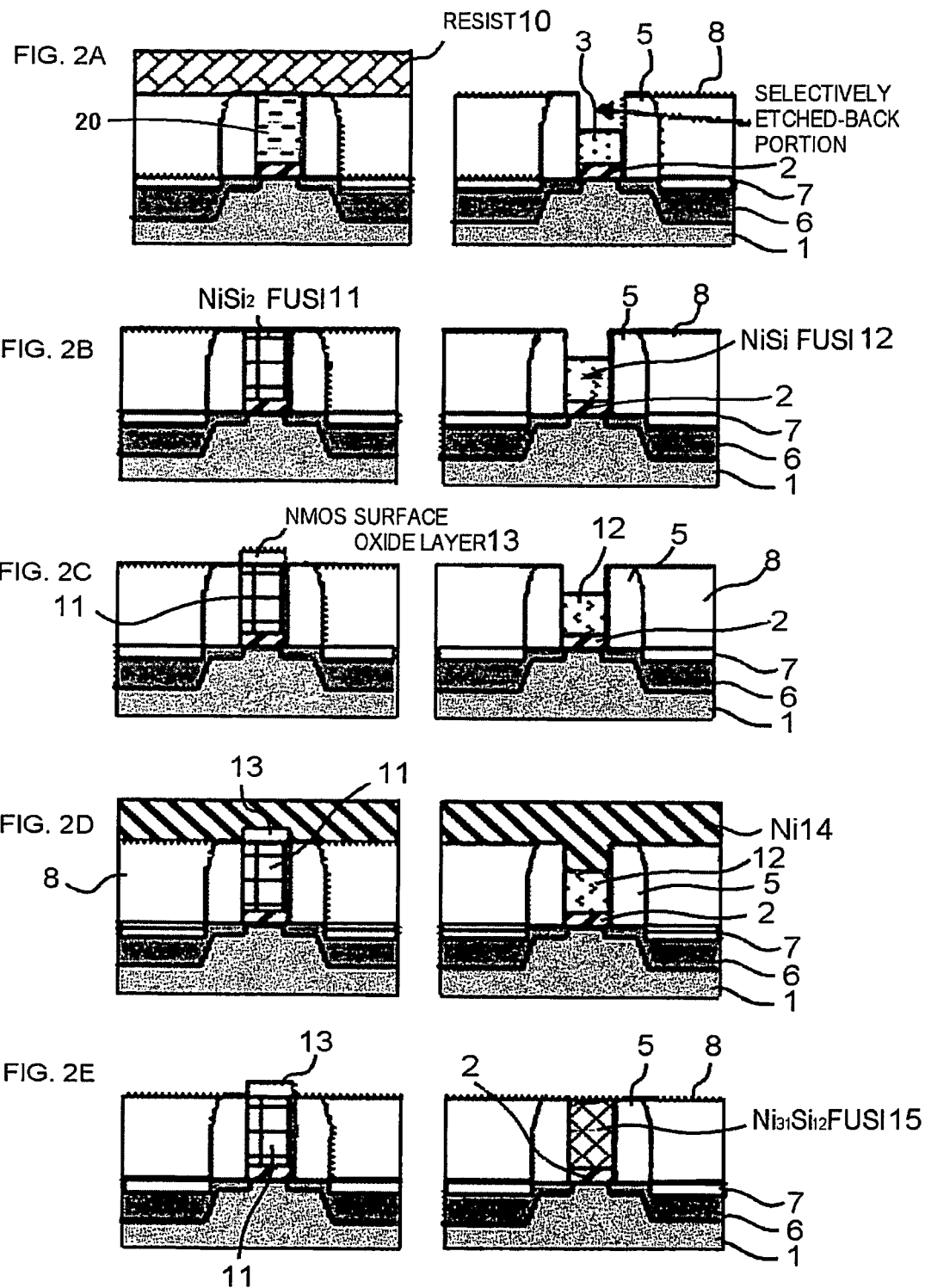

NMOS　　　PMOS
FIG. 4A 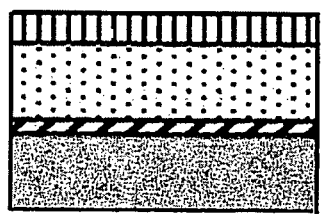 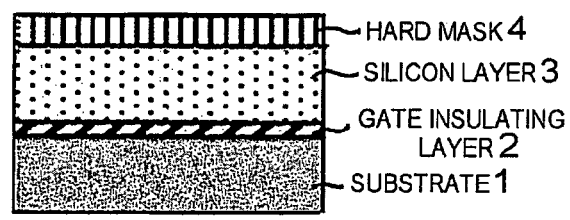
HARD MASK 4
SILICON LAYER 3
GATE INSULATING LAYER 2
SUBSTRATE 1
FIG. 4B 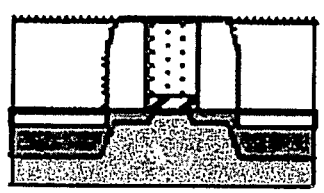 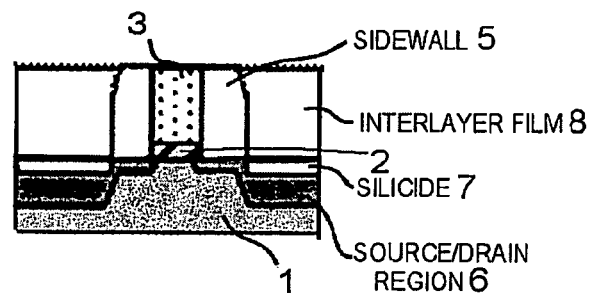
SIDEWALL 5
INTERLAYER FILM 8
SILICIDE 7
SOURCE/DRAIN REGION 6
FIG. 4C 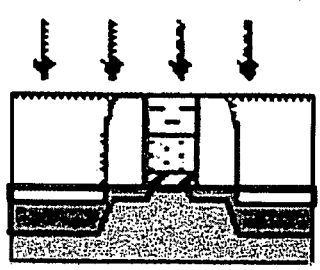 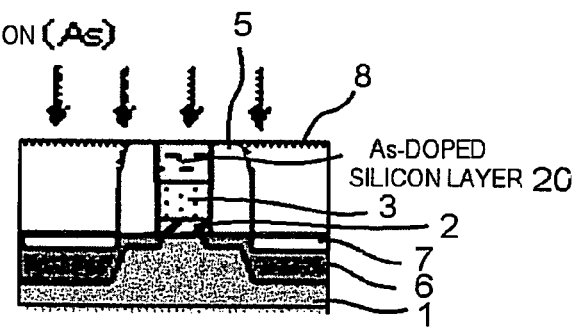
ION IMPLANTATION (As)
As-DOPED SILICON LAYER 20
FIG. 4D 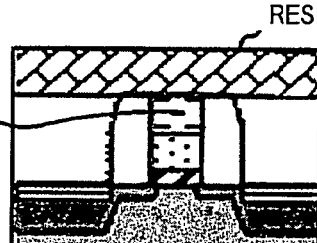 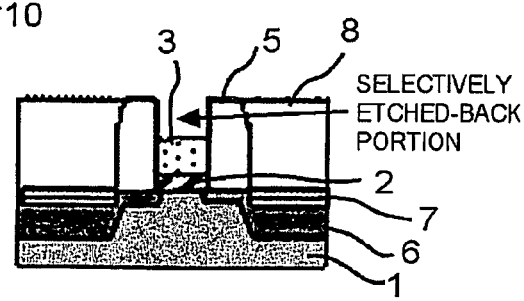
RESIST 10
SELECTIVELY ETCHED-BACK PORTION

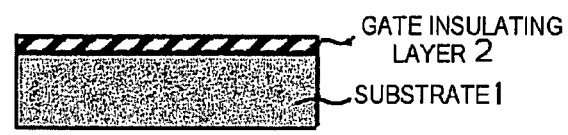
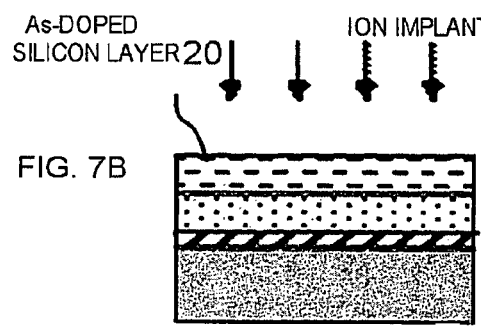
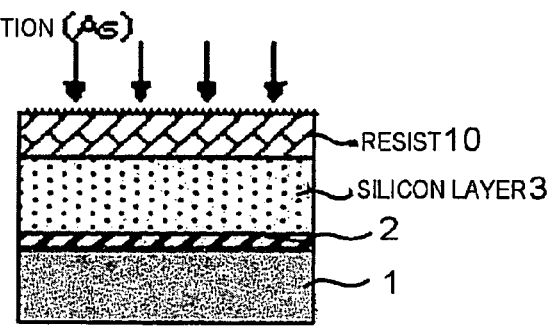
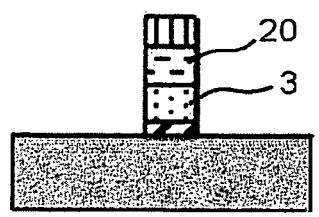
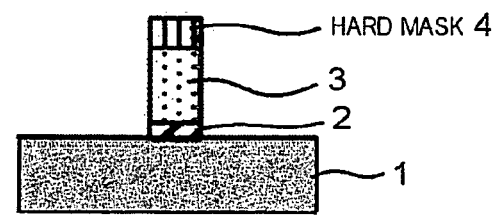
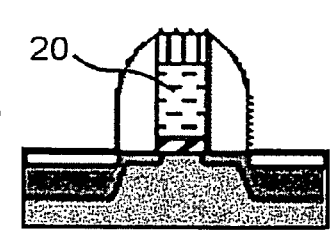
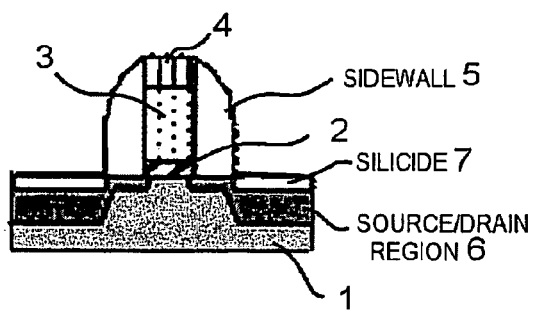
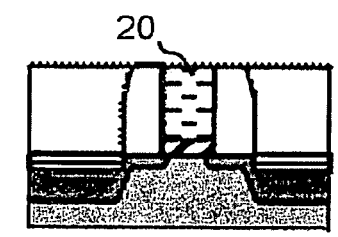
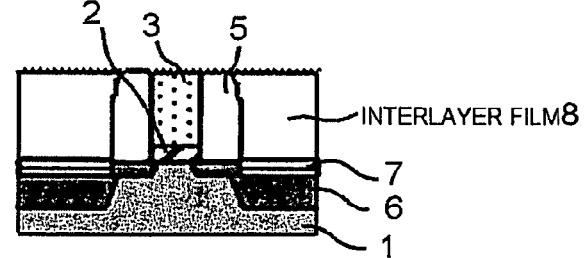

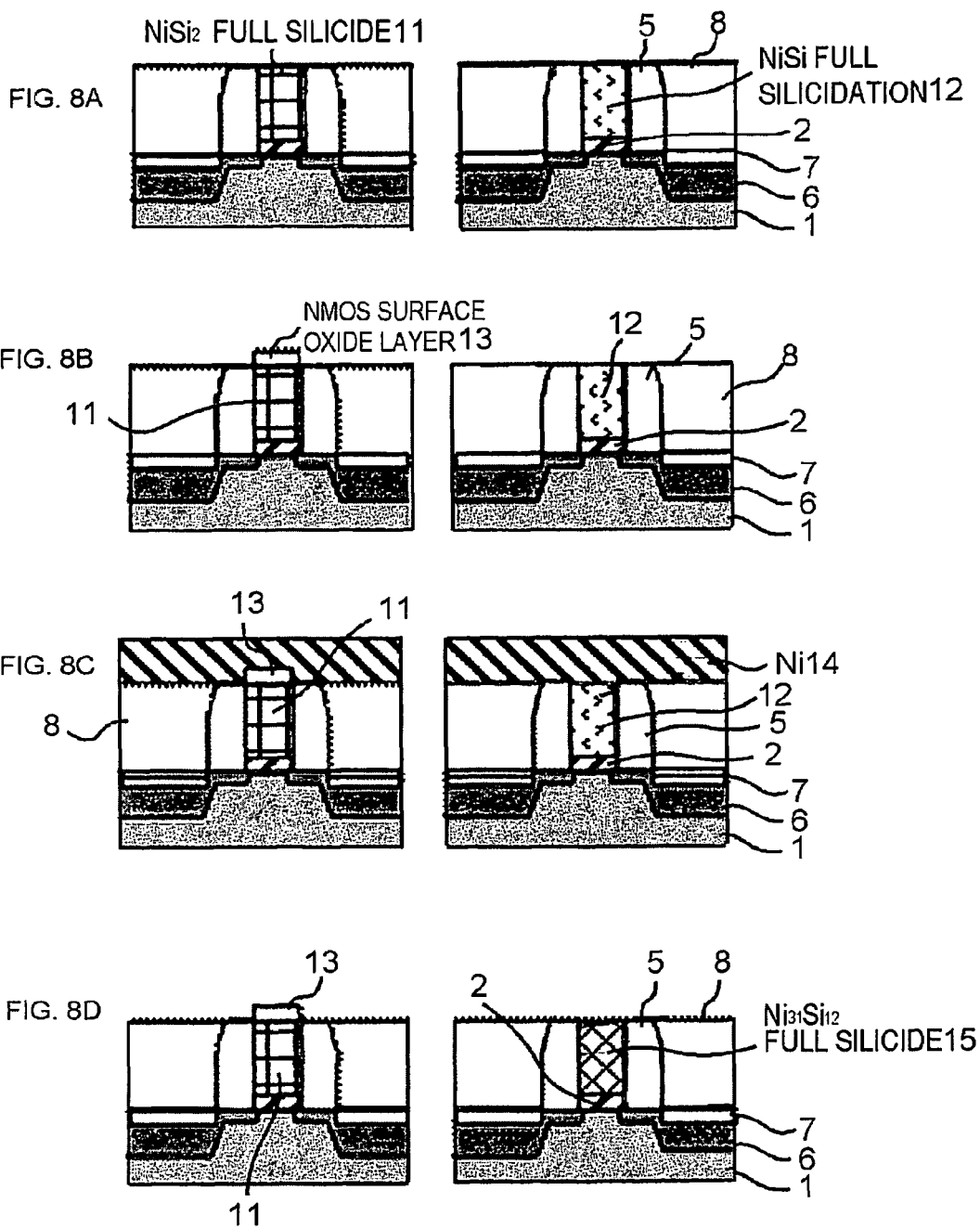

METHOD OF MANUFACTURING SEMICONDUCTOR DEVICE

This application is based on Japanese patent application No. 2007-065232, the content of which is incorporated hereinto by reference.

BACKGROUND

1. Technical Field

The present invention relates to a method of manufacturing a semiconductor device, and more particularly to a method of manufacturing a semiconductor device that includes a metal-insulator-semiconductor (hereinafter, MIS) structure such as a field effect transistor.

2. Related Art

Investigations are being made on techniques for executing work function control or composition control of a gate electrode of a PMOS and NMOS transistor, in the attempt to better control the threshold voltage of the PMOS and NMOS transistor, which is essential for properly driving the transistor. Also, use of a metal electrode for preventing depletion of the gate electrode is currently focused on, and in particular the technique of forming a fully silicided (hereinafter, FUSI) gate electrode, which is a gate electrode turned into silicide down to the interface with the gate insulating layer, is being widely studied, because of the consistency with the manufacturing process so far developed.

In Japanese Laid-Open Patent Publication No. 2006-100431, it is disclosed a method of manufacturing a semiconductor device including employing polycrystalline silicon to form a gate electrode for the PMOS and the NMOS on a gate oxide nitride layer (SiON), implanting as impurity boron (B) into the gate electrode for the PMOS and arsenic (As) into the gate electrode for the NMOS respectively through a resist mask, and depositing Ni on the gate electrode for full silicidation thereof. Distributing the impurity on the interface between the gate oxide nitride layer and the FUSI gate electrode is intended for controlling the work function.

It is disclosed in IEEE 2005 "Physical Mechanism of Work Function Modulation due to Impurity Pileup at Ni-FUSI/SiO (N) Interface", that the composition and orientation of the silicide phase depend on the impurity implanted in advance into the polysilicon before the silicidation process.

In IEDM 2004 "Dual Work function Ni-Silicide/HfSiON Gate Stacks by Phase-Controlled Full-Silicidation (PC-FUSI) Technique for 45 nm-node LSTP and LOP Devices", and Symposium on VLSI Technology Digest of Technical Papers 2005 "Highly Reliable HfSiON CMOSFET with Phase Controlled NiSi (NFET) and Ni3Si (PFET) FUSI Gate Electrode", phase of the FUSI gate electrodes are appropriately controlled for the PMOS transistor and the NMOS transistor by changing Ni film thickness when forming the FUSI gate electrodes on HfSiON gate insulating films. With this structure, the threshold voltage of the CMOS can be appropriately controlled.

In Symposium on VLSI Technology Digest of Technical Papers 2006 "Dual Work function Phase Controlled Ni-FUSI CMOS (NiSi NMOS, Ni2Si or Ni31Si12 PMOS): Manufacturability, Reliability & Process Window Improvement by Sacrificial SiGe cap", and IEEE 2005 "CMOS Integration of Dual Work Function Phase Controlled Ni FUSI with Simultaneous Silicidation of NMOS (NiSi) and PMOS (Ni-rich silicide) Gates on HfSiON", the formation of FUSI electrodes having appropriate silicide phase by performing an etch back of the poly-silicon of the PMOS transistor to suppress the volume expansion at the time of forming Ni rich silicide. In these documents, impurity is not introduced into the gate electrodes and the composition of silicide phase is controlled by the thickness ratio of the Ni layer and the poly-silicon layer. In these documents, HfSiON is used as gate insulating films.

It has now been discovered by the inventor that in order to form the NMOS and the PMOS gate electrode at a time such that the NMOS-side silicide becomes more Si-rich than $Ni_2Si$ while the PMOS-side silicide becomes more Ni-rich than $Ni_2Si$, to thereby obtain the NMOS and the PMOS transistor having the FUSI gate electrode, it is necessary to control the supply of Ni to the polysilicon on the NMOS side during the full silicidation process. Accordingly, complicated steps have to be inevitably taken, in order to form the silicide phase of an appropriate composition on the respective gate electrodes. Such drawback is prominently observed especially when HfSiON is employed as the gate insulating layer.

The present invention has been accomplished in view of the foregoing situation, and provides a method of manufacturing a semiconductor device that facilitates obtaining a full silicide phase of a suitable composition for an NMOS transistor and a PMOS transistor respectively, with fewer mask layers and through a fewer number of manufacturing steps.

SUMMARY

In one embodiment, there is provided a method of manufacturing a semiconductor device comprising a PMOS transistor and an NMOS transistor, comprising: forming a silicon layer over a substrate through a gate insulating film; forming a first gate electrode and second gate electrode by patterning said silicon layer, said first gate electrode being a gate electrode of NMOS transistor, and said second gate electrode being a gate electrode of said PMOS transistor; forming an interlayer film covering said first and said second gate electrodes; forming a first metallic layer formed of a metal capable of forming a silicide over said first and said second gate electrodes; executing a first heat treatment process to form a first silicide from said first metallic layer; selectively forming an oxide layer on said silicon layer of said first gate electrode subjected to said first heat treatment process; forming a second metallic layer of a metal capable of forming a silicide over said first and second gate electrodes subjected to said first heat treatment; executing a second heat treatment process; and removing an unreacted portion of said metallic layer and said oxide layer after said first and said second heat treatment process.

By the manufacturing method thus arranged, the oxide layer is selectively formed on the silicon layer of the NMOS-side gate electrode. The oxide layer inhibits further silicidation reaction on the NMOS side during the second heat treatment, thereby facilitating forming a relatively metal-rich second FUSI phase on the PMOS side. Such process allows forming the silicide electrodes of different compositions on the NMOS and PMOS side respectively, through a fewer number of manufacturing steps without performing a lithography process.

Thus, the present invention provides a method of manufacturing a semiconductor device that facilitates obtaining a full silicide phase of a suitable composition for an NMOS transistor and a PMOS transistor respectively, with fewer mask layers and through a fewer number of manufacturing steps.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 1A to 1E are cross-sectional views sequentially showing a manufacturing process of a semiconductor device, according to a first embodiment of the present invention;

FIGS. 2A to 2E are cross-sectional views sequentially showing a manufacturing process of a semiconductor device, according to the first embodiment;

FIGS. 4A to 4D are cross-sectional views sequentially showing a manufacturing process of a semiconductor device, according to a second embodiment of the present invention;

FIGS. 7A to 7E are cross-sectional views sequentially showing a manufacturing process of a semiconductor device, according to a third embodiment of the present invention; and FIGS. 8A to 8D are cross-sectional views sequentially showing a manufacturing process of a semiconductor device, according to the third embodiment.

DETAILED DESCRIPTION

Figure 3:
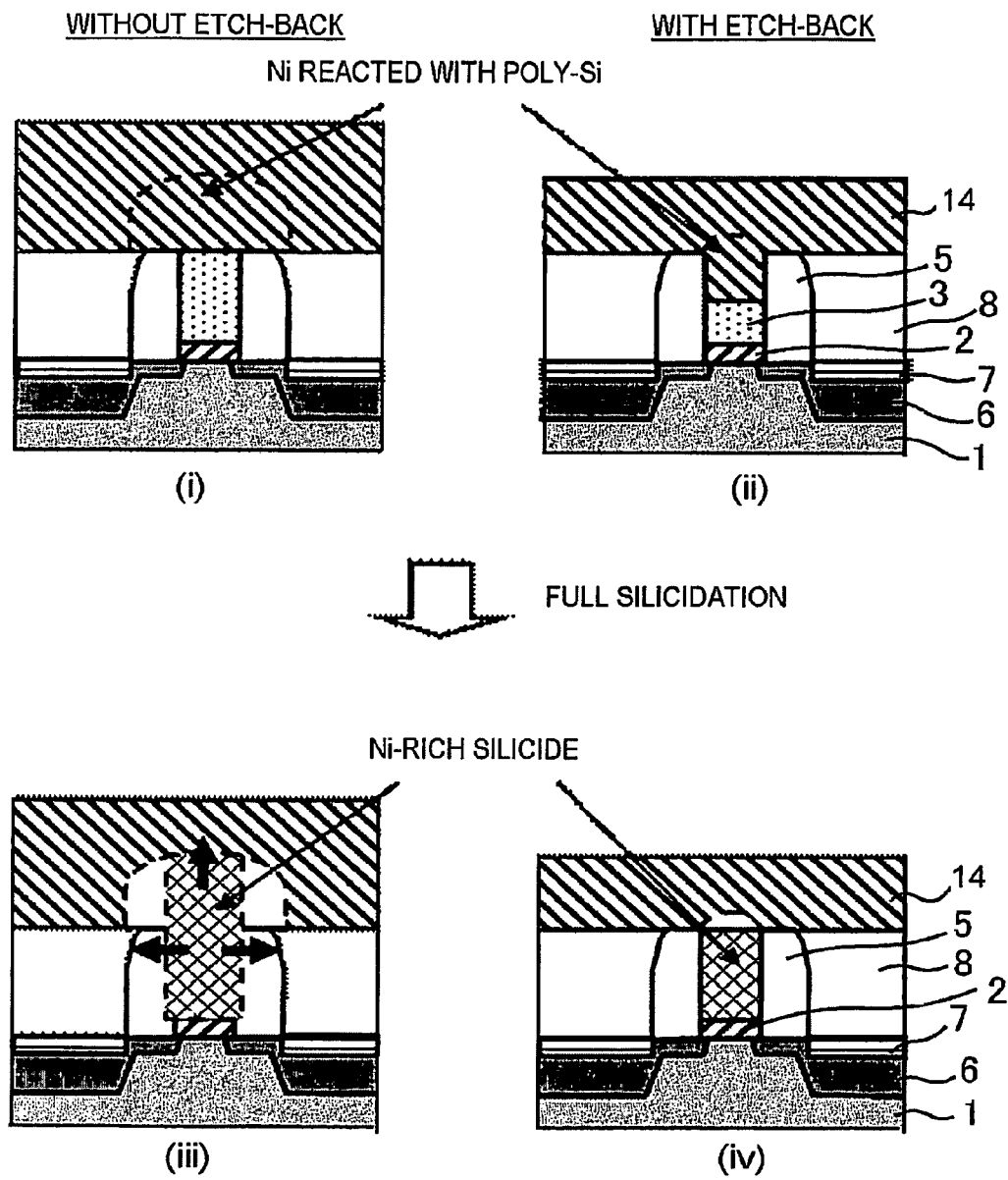
FIG. 3 includes cross-sectional views showing the effect of a selective etch-back process performed on polycrystalline silicon on the PMOS side, according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a method of manufacturing a semiconductor device according to the present invention will be described in details, referring to the accompanying drawings. The following embodiments represent the case where polycrystalline silicon is employed as a silicon layer, a HfSiON layer formed on a base oxide layer of 1.5 nm as a gate insulating layer, and Ni as a metal for forming a FUSI electrode. Other suitable materials include non-crystalline silicon for the silicon layer, a high-k gate insulating layer containing Hf, such as $HfO_2$, HfON, HfLaON, for the gate insulating layer, and Pt and Pd for the metal for forming the FUSI electrode. In all the drawings, same constituents are given the same numeral, and the description thereof will not be repeated.

First Embodiment

Referring to FIGS. 1A to 2E, a method of manufacturing a semiconductor device according to a first embodiment of the present invention will be described hereunder.

An oxide layer that serves as the base of a high-k gate insulating layer 2 is formed on a Si substrate 1 in a thickness of 1.0 nm by a thermal oxidation process, and a CVD process is performed so as to deposit a HfSiO layer in a thickness of 2.0 nm. The HfSiO layer is nitrided though a plasma nitriding process, to thereby form a HfSiON gate insulating layer 2 (FIG. 1A). In FIGS. 1A to 2E, the left-hand side of the drawing represents the NMOS-side region, and the right-hand side the PMOS-side region.

Then a polycrystalline silicon layer 3 is deposited on the gate insulating layer 2 in a thickness of 100 nm, and a lithography process is performed so as to implant As at an acceleration voltage of 10 keV and in a concentration of $6\times10^{15}$ $cm^{-2}$, only into the region where the NMOS-side gate electrode is to be formed, i.e. with the PMOS-side region being covered with a resist 10 (FIG. 1B). As a result, an As-doped silicon layer 20 is formed on the NMOS side.

Further a nitride layer is formed in a thickness of 50 nm which is to serve as a hard mask 4 for processing the gate electrode, and after patterning the resist by lithography, an etching process is performed over the polycrystalline silicon layer 3 and gate insulating layer 2, through the hard mask 4 (FIG. 1C).

After forming an oxide layer offset spacer of a thickness of 8 nm, followed by implantation of an extension pocket, activation off the implanted impurity, and formation of an oxide layer sidewall 5 of a thickness of 40 nm, ion implantation is performed so as to form a source/drain region, and then a spike anneal process is performed at a temperature of 1000° C. or higher for activation. These activation heat treatment processes causes the As implanted into the NMOS-side silicon layer to diffuse throughout the entire gate electrode. The activation process referred to above includes, generally, a heat treatment at a temperature of 900° C. or higher that causes the impurity implanted into the silicon to act as a donor or an accepter. After removing a natural oxide layer from the source/drain region, a sputtering process is performed to form a Ni layer in a thickness of 8 nm, and then heat treatment is performed so as to form a Ni silicide 7 of approximately 20 nm in thickness, over the source/drain region. At this moment, the hard mask 4 of the nitride layer covering the polycrystalline silicon of the gate inhibits formation of a silicide (FIG. 1D).

Then an interlayer film 8, constituted of an oxide layer of a thickness of 300 nm or lower, is formed all over and planarized by a CMP process, and a dry etch-back process may be performed if necessary, so as to expose an upper portion of the polycrystalline silicon layer 3 of the gate, with the source/drain region 6 being covered with the interlayer film 8. At this moment, the nitride layer employed as the hard mask is also removed in the dry etch-back process (FIG. 1E). In the case where the circuit design requires a device in which polycrystalline silicon does not have to be silicided, such device may be masked by a lithography process before performing the dry etch-back process.

Then only the NMOS-side region is covered with the resist 10 by a lithography process, and the PMOS-side polycrystalline silicon layer 3 its selectively etched with respect to the oxide layer. It is preferable to set the etching depth such that the heights of the NMOS and PMOS gate electrode become substantially the same after the full silicidation. In this embodiment, the etch-back depth is set at 50 nm, which is approximately half the height of the polycrystalline silicon layer, because the PMOS side is to be turned into a $Ni_{31}Si_{12}$ phase, and the NMOS side into a $NiSi_2$ phase (FIG. 2A).

After removing the resist 10, a dry etching process utilizing a $NF_3/NH_3$ gas or a wet etching process utilizing dilute fluoric acid is performed, so as to remove again the oxide layer on the NMOS-side polycrystalline silicon and the PMOS-side polycrystalline silicon. This is followed by successive deposition of NiZr in a thickness of 5 nm and Ni in a thickness of 30 nm over both of the NMOS and PMOS regions. The Ni of 30 nm corresponds to the amount that gives, upon being entirely reacted with the 100 nm of polycrystalline silicon, a Ni silicide containing Ni and Si in a ratio of approximately 1:2, and the NiZr serves as a barrier that suppresses the supply of Ni into Si. Such structure is subjected to a heat treatment process of five minutes at a temperature of 400° C. and in a $N_2$ atmosphere to thereby form the first silicide, and a residual (unreacted) portion of the Ni is removed by an etching process utilizing aqueous solution of sulfuric acid and hydrogen peroxide. Since the NiZr layer interleaved between the Ni and Si serves as a diffusion barrier against the diffusion of Ni into Si, the supply of Ni into Si is suppressed, and therefore a NiSi$_2$ FUSI phase 11, which is normally not formed, can be obtained at a temperature as low as 400° C. On the PMOS side, although NiSi$_2$ is formed halfway of the reaction because of the barrier effect of the NiZr layer, finally a NiSi FUSI phase 12 is formed since 30 nm of Ni corresponds to the amount that gives, upon being entirely reacted with 50 nm of polycrystalline silicon, a Ni silicide containing Ni and Si in a ratio of approximately 1:1 (FIG. 2B).

Then a dry etching process is performed with a NF$_3$/NH$_3$ gas for a short period of time, to thereby once remove a natural oxide layer from the surface of the silicide. After that, the structure is subjected to heated aqueous solution containing sulfuric acid and hydrogen peroxide in a ratio of 4:1, to thereby form a chemical oxide layer on the silicide electrode formed as above. As a result, in the NMOS-side region a relatively thick chemical oxide layer 13 is formed because of the presence of the As, and in the PMOS-side region which is undoped a relatively thin oxide layer is formed (FIG. 2C).

Further, without removing the chemical oxide layer 13, Ni 14 is deposited as a silicide metal to a thickness of 60 nm, at room temperature (FIG. 2D). The 60 nm of Ni 14 corresponds to the amount that gives, upon being entirely reacted with the NiSi FUSI phase 12 already formed on the PMOS side, a Ni silicide containing Ni and Si in a ratio of approximately 3:1. This is followed by a heat treatment process that causes reaction between the previously formed silicide electrode and the newly deposited Ni and thus forms a second silicide, after which a residual (unreacted) Ni is removed by an etching process with aqueous solution containing sulfuric acid and hydrogen peroxide (FIG. 2E). Preferably, the heat treatment process is performed at a temperature of 400° C. and in a N$_2$ atmosphere, for five minutes.

In the NMOS-side region the relatively thick oxide layer 13 formed because of the implanted As inhibits the silicidation reaction, so as to keep the first silicide electrode from reacting. In contrast, in the PMOS-side region the 60 nm of Ni is reacted with the previously formed NiSi FUSI phase 12 to thereby give a Ni FUSI phase 15 containing Ni and Si in a ratio of 3:1. Actually, it was confirmed by X-ray diffraction that the silicide phase thus formed was Ni$_{31}$Si$_{12}$. The FUSI gate electrode obtained through such silicidation reaction expands in volume to approximately twice as large as the original polycrystalline silicon, and hence the height of the electrode returns to approximately 100 nm, which is generally the same as the height on the NMOS side (FIG. 2E).

In the case where the selective etch-back process is not performed on the PMOS-side polycrystalline silicon, not only the Ni located right upon the gate but also the Ni in a peripheral region is involved in the reaction as shown in FIG. 3(i). Then the FUSI electrode is forced, upon expanding to a double volume, to laterally expand because the upper face thereof is suppressed by unreacted Ni, and push the sidewall outside thus destroying the device (FIG. 3(iii)). In contrast, in the case where the selective etch-back process is performed so as to form the downwardly recessed portion as shown in FIG. 3(ii), the given silicide is smaller in volume than the total of the Ni and the polycrystalline silicon before the reaction, and hence the space created from the consumption of Ni can absorb the increase in volume because, which suppresses an increase in stress originating from the increase in volume, thereby preventing destruction of the device (FIG. 3(iv)).

Through the foregoing composition control, the effective work function of the NMOS and PMOS FUSI gate electrode becomes 4.4 eV and 4.8 eV respectively, which means reduction in threshold voltage of approximately 0.1 V for the NMOS and approximately 0.3 V for the PMOS, in comparison with an ordinary NiSi electrode (effective work function 4.5 eV).

According to this embodiment, the present invention provides the advantage that the polycrystalline silicon in both of the NMOS and PMOS regions can be simultaneously exposed, which simplifies the process in comparison with independently exposing the polycrystalline silicon to thereby siliciding the NMOS and PMOS regions by turns. The lithography process involved in the formation of the FUSI electrode has only to be performed in the As implantation into the polycrystalline silicon of the NMOS-side region immediately after forming the polycrystalline silicon layer, and in the selective etch-back process of the PMOS-side gate silicon, which does not incur an increase in times of exposure, when compared with a process for an ordinary polycrystalline silicon gate electrode that requires gate impurity implantation into each of the NMOS and PMOS regions immediately after the formation of the polycrystalline silicon.

Also, this embodiment adopts the steps of once forming the first Ni silicide, removing the unreacted portion of Ni, forming the oxide coating layer on the silicide surface by oxidation, and again depositing Ni to form the second silicide. This is because otherwise the surface of the unreacted Ni is also oxidized when forming the oxide coating layer, which may impede removing the residual Ni by etching after forming the second silicide. Accordingly, in the case of performing the oxidation under a condition that can prevent such phenomenon, the formation of the first silicide and the oxidation may be successively performed before forming the second silicide, thus forming the overall silicide structure.

Second Embodiment

This embodiment is different from the first embodiment in executing the impurity implantation not after depositing the polycrystalline silicon layer on the gate insulating layer as in the foregoing process, but after exposing the upper portion of the polycrystalline silicon of the gate, without performing the lithography process. Referring to FIGS. 4A to 5D, such process will be described hereunder.

After forming the gate insulating layer 2 and the polycrystalline silicon layer 3, the nitride layer hard mask 4 to be used for processing the gate is formed, without implanting an impurity into the silicon layer 3 (FIG. 4A). Thereafter, the same steps as those of the first embodiment are taken until exposing the upper portion of the polycrystalline silicon of the gate (FIG. 4B).

Then an impurity that serves to promote the formation of a surface oxide layer is implanted into both of the NNOS-side and the PMOS-side gate electrode, without performing a lithography process. In this embodiment also, As is implanted at an acceleration voltage of 10 keV and in a concentration of $6 \times 10^{15}$ cm$^{-2}$, as in the first embodiment. Under such implantation condition, a majority of the As remains within a depth of 50 nm from the surface of the silicon layer, unless such a heat treatment that can diffuse the implanted impurity is performed (As-doped silicon layer 20 in FIG. 4C).

Then only the polycrystalline silicon 3 on the PMOS side is selectively etched back by a lithography process to a depth of 50 nm as in the first embodiment. As a result, the As remains as impurity in the NMOS-side region not subjected to the selective etch-back, while the PMOS-side region subjected to the selective etch-back turns to a substantially undoped state (FIG. 4D). In other words, a portion in which the As is introduced is removed from the PMOS-side gate electrode. In this step, however, it is not mandatory to remove the entirety of the impurity introduced into the PMOS-side gate electrode, but it suffices to remove the impurity to such an extent to inhibit the formation of the silicon oxide layer, which serves to differentiate the silicide composition between the NMOS and the PMOS gate electrode.

Figure 5A:
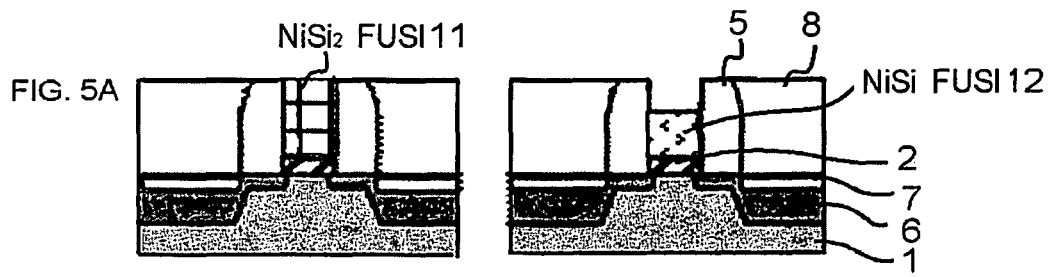
FIGS. 5A to 5D are cross-sectional views sequentially showing a manufacturing process of a semiconductor device, according to the second embodiment.
Figure 5B:
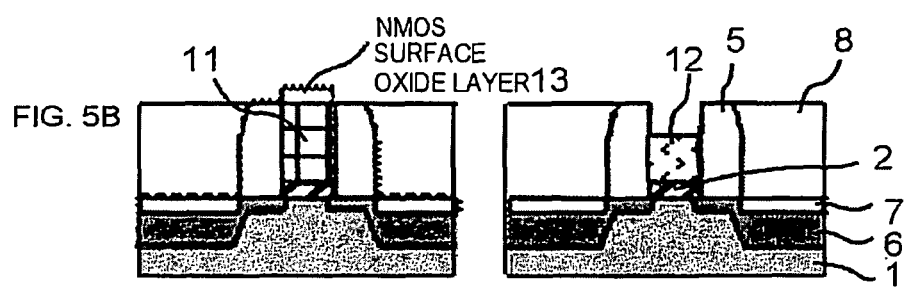
Figure 5C:
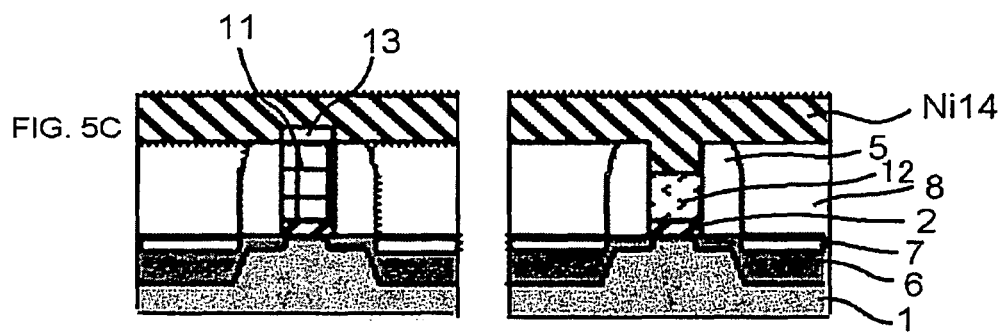
Figure 5D:
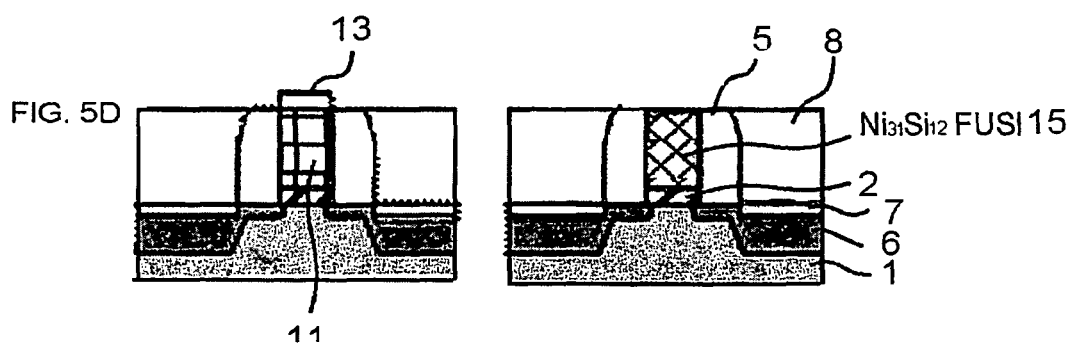

After removing the resist, again the same steps as those of the first embodiment are taken, from one of the dry etching process utilizing a $NF_3/NH_3$ gas and the wet etching process utilizing dilute fluoric acid to the final step (FIGS. 5A to 5C), to thereby form the FUSI electrode including the $NiSi_2$ FUSI phase 11 on the NMOS side and the $Ni_{31}Si_{12}$ FUSI phase 15 on the PMOS side, as in the first embodiment (FIG. 5D).

In this embodiment, although the As, the implanted impurity, is not subjected to a heat treatment process, the formation of the surface oxide layer on the silicide which is promoted by the As can be substituted by formation of a chemical oxide layer as that of the first embodiment on the NMOS side, irrespective of whether a heat treatment such as activation is performed.

The essential advantage of the present invention described in this embodiment lies in that, when respectively defining the different composition of the Ni silicide in the NMOS region and the PMOS region, the two lithography processes required for the impurity implantation and the etch-back of the PMOS gate silicon layer can be substituted by a single etch-back of the PMOS gate silicon layer, which leads to a fewer number of manufacturing steps.

Figures 6A, 6B, 6C:
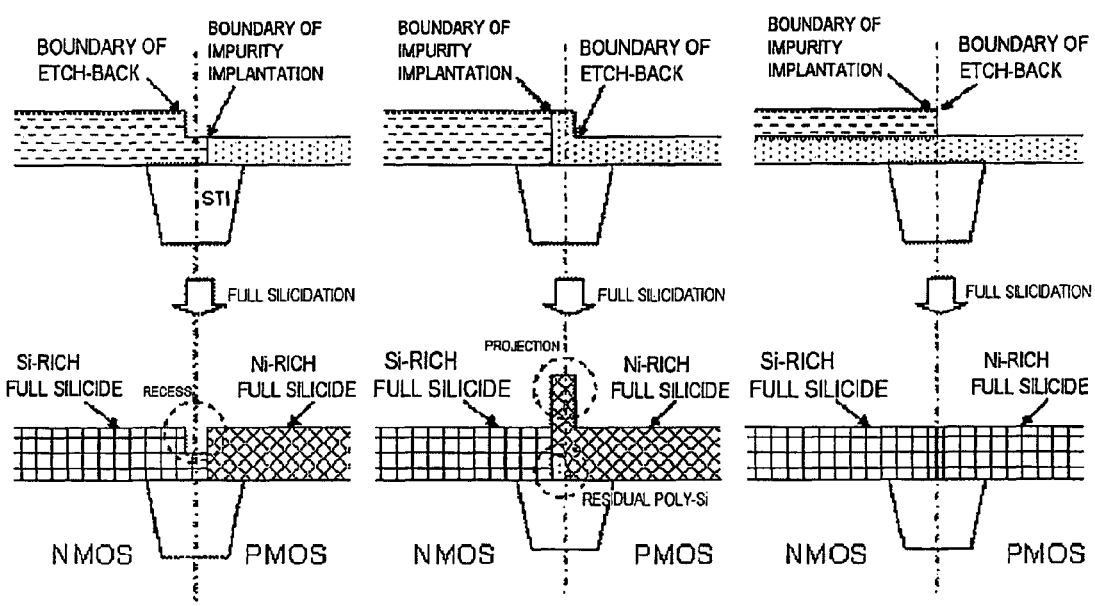
FIGS. 6A to 6C are cross-sectional views showing shapes of junction interfaces in NMOS/PMOS gate electrodes according to the present invention and conventional ones.

Also, separately performing the lithography process for the impurity implantation and for the selective etch-back process of the PMOS gate silicon, as in the first embodiment, incurs such a situation that in the vicinity of the boundary between the NMOS region and the PMOS region, two boundaries are separately defined, namely the boundary of the impurity distribution and that of the height of the gate silicon. Therefore, upon completion of the full silicidation, the gate shape around the boundary becomes irregular depending on the positional relationship of the two boundaries, and hence the gate shape has to be controlled (FIGS. 6A, 6B). Unlike the above, this embodiment provides the advantage that the gate structure remains stable with only a practically negligible gap in height after the full silicidation (FIG. 6C), because the boundary of the impurity distribution coincides with that of the height of the gate silicon.

Third Embodiment

This embodiment is different from the first embodiment in skipping the selective etch-back on the polycrystalline silicon 3 on the PMOS side. Referring to FIGS. 7A to 8D, such process will be described hereunder.

The same steps as those of the first embodiment are taken, from forming the gate insulating layer 2 and the polycrystalline silicon layer 3, implanting the impurity into the silicon layer on the NMOS side and exposing the upper portion of the polycrystalline silicon (FIGS. 7A to 7E). Then the $NiSi_2$ FUSI phase 11 and the NiSi FUSI phase 12 are formed on the NMOS side and the PMOS side respectively as in the first embodiment, without performing the selective etch-back on the polycrystalline silicon layer 3 on the PMOS side (FIG. 8A). The subsequent steps (FIGS. 8B to 8D) are performed as described referring to FIGS. 2C to 2E.

In all the foregoing embodiments, the chemical oxide layer formed from the sulfuric acid and hydrogen peroxide aqueous solution was employed as the surface oxide layer. This is because such oxide layer contains many dangling bonds and is hence not relatively solid, and therefore the silicidation reaction can be expected to proceed through the oxide layer in the case where the oxide layer is sufficiently thin. In the NMOS-side region where the As has been implanted, the oxide layer becomes thick or obtains a dense film structure because of the presence of the As, and thereby the silicidation reaction is suppressed. Such differentiation in forming the surface oxide layer may be made from a different chemical solution or under a different temperature, or by adopting a different method such as an oxygen plasma processing under a low temperature or a heat treatment process under a low temperature in an oxygen atmosphere. It is to be noted, however, that in the case where the oxide layer formed on the PMOS-side silicon layer is excessively thick or solid the silicidation reaction is suppressed also on the PMOS side, and that on the contrary when the NMOS-side oxide layer is excessively thin or coarse, the silicidation reaction also proceeds on the NMOS side. Accordingly, an optimal forming condition of the oxide layer has to be investigated.

It is also possible to unify the process of forming the oxide layer on the surface of the first silicide with the step of removing the unreacted Ni after the formation of the first silicide. In this case, for example a heated aqueous solution containing sulfuric acid and hydrogen peroxide in a ratio of 4:1 may be employed, which enables removing the unreacted Ni while forming the surface oxide layer that can suppress the silicidation reaction only in the NMOS-side region where the As has been introduced.

Regarding the concentration of $6\times10^{15}$ cm$^{-2}$ of the As implantation according to the foregoing embodiments, it is to be noted that the promoting effect on the formation of the surface oxide layer depends on the implantation concentration, such that a lower concentration leads to a weaker promoting effect. In order to secure a sufficient difference from the oxide layer formed on the undoped silicon layer, it is preferable to set the concentration at equal to or higher than $3\times10^{15}$ cm$^{-2}$.

Also, it is preferable to employ Ni as the FUSI metal according to the present invention. This is because, based on the common knowledge that the Ni silicide can be formed in largely different compositions from Ni:Si=3:1 ($Ni_3Si$) to Ni:Si=1:2 ($NiSi_2$), employing Ni allows controlling the work function over an extensive range, when controlling the effective work function based on the Si ratio in the FUSI electrode. In addition, metals such as Ni, Pt, and Pd diffuse throughout the silicon layer without causing the silicon to diffuse, when forming the metal silicide, and hence a defect such as a void is barely produced in the silicide.

Further, although the $Ni_{31}Si_{12}$ phase is formed on the PMOS side and the $NiSi_2$ phase on the NMOS side in the foregoing embodiments, the $Ni_3Si$ phase may be formed on the PMOS side and the NiSi phase on the NMOS side. The silicides of such different compositions can be easily formed as desired, by setting appropriate values of the Ni layer thickness to be deposited or the silicidation temperature for the respective cases.

Still further, the NiZr layer is interleaved for forming the $NiSi_2$ phase in the foregoing embodiments, a different method may be adopted, as long as the layer thereby formed inhibits the diffusion of Ni through the silicon. Known such methods include employing a chemical oxide layer, interleaving a Ti layer, and depositing a Ni—Zr alloy, all of which suppress the supply rate of Ni to be involved in the silicidation reaction, thereby allowing obtaining the $NiSi_2$ phase.

Through the foregoing passages the embodiments of the present invention have been described referring to the drawings, however those are merely examples of the present invention and various modifications may be made without departing from the scope of the present invention.

For example, although HfSiON is employed as the gate insulating layer in the foregoing embodiments, other materials may be employed instead.

It is apparent that the present invention is not limited to the above embodiment, and may be modified and changed without departing from the scope and spirit of the invention.

What is claimed is:

1. A method of manufacturing a semiconductor device comprising a PMOS transistor and an NMOS transistor, comprising:
    forming a silicon layer over a substrate through a gate insulating film;
    forming a first gate electrode and second gate electrode by patterning said silicon layer, said first gate electrode being a gate electrode of NMOS transistor, and said second gate electrode being a gate electrode of said PMOS transistor;
    forming an interlayer film covering said first and said second gate electrodes;
    forming a first metallic layer formed of a metal capable of forming a silicide over said first and said second gate electrodes;
    executing a first heat treatment process to form a first silicide from said first metallic layer;
    selectively forming an oxide layer on said silicon layer of said first and second gate electrodes subjected to said first heat treatment process, a thickness of said oxide layer on said first gate electrode being greater than a thickness of said oxide layer on said second gate electrode;
    forming, on said oxide layer, a second metallic layer of a metal capable of forming a silicide over said first and second gate electrodes subjected to said first heat treatment;
    executing a second heat treatment process; and
    removing an unreacted portion of said metallic layer and said oxide layer after said first and said second heat treatment process.

2. The method according to claim 1, further comprising introducing an impurity that promotes formation of an oxide layer, into said silicon layer of said first gate electrode, before said forming a first metallic layer.

3. The method according to claim 2, wherein said introducing an impurity includes forming a mask over an area of said second gate electrode.

4. The method according to claim 2, wherein said selectively forming an oxide layer on said silicon layer of said first gate electrode subjected to said first heat treatment process includes:
    introducing said impurity into both of said first gate electrode and said second gate electrode before said forming a first metallic layer; and
    removing a region where said impurity is introduced from said second gate electrode.

5. The method according to claim 2, wherein said impurity is arsenic.

6. The method according to claim 5, wherein said impurity, arsenic, is provided in said silicon layer in a concentration equal to or higher than $3 \times 10^{15}$ atoms/cm2.

7. The method according to claim 1, wherein said forming an oxide layer includes employing a chemical solution capable of oxidizing.

8. The method according to claim 1, wherein said forming an oxide layer includes performing one of a heat treatment process or a plasma processing, utilizing an oxidizing gas.

9. The method according to claim 1, wherein said first and said second metallic layer contain Ni.

10. The method according to claim 1, wherein at least an upper surface of said gate insulating layer includes one of a Hf oxide, a Hf silicate, and a nitride thereof.

11. The method according to claim 1, wherein said forming a first metallic layer includes:
    forming a NiZr layer over said first and said second gate electrodes; and
    forming said first metallic layer on said NiZr layer.

* * * * *